United States Patent [19]

Kubo

[11] 3,982,315

[45] Sept. 28, 1976

[54] PHOTOELECTRIC DEVICE

[75] Inventor: Shuji Kubo, Kawasaki, Japan

[73] Assignee: Matsushita Electric Industrial Co., Ltd., Kadoma, Japan

[22] Filed: Jan. 9, 1975

[21] Appl. No.: 539,811

Related U.S. Application Data

[62] Division of Ser. No. 364,314, May 29, 1973, abandoned.

[30] Foreign Application Priority Data

June 2, 1972 Japan.............................. 47-55284

[52] U.S. Cl.................................. 29/572; 29/580; 29/583; 357/30
[51] Int. Cl.$^2$.......................................... B01J 17/00
[58] Field of Search...................... 29/580, 583, 572

[56] References Cited
UNITED STATES PATENTS 3,701,696 10/1972 Mets..................................... 29/580
3,796,612 3/1974 Allison................................. 29/580

*Primary Examiner*—W. Tupman

[57] ABSTRACT

An n-type epitaxial layer is grown on a p-type silicon substrate. The epitaxial layer is photo-etched to provide a plurality of isolated regions of n-type conductivity. A silicon dioxide layer is provided on a surface covering the isolated regions and etched portions. The oxide layer is etched to provide a window which allows external light to fall on the exposed isolated region. Heat treatment steps have been reduced to a minimum to prevent lattice defects from occurring, resulting in a photodiode having a higher sensitivity to the visible spectrum range with less dark current.

5 Claims, 6 Drawing Figures

Step 1

Step 2
(HEAT APPLIED)

Step 3

P-TYPE DIFFUSION

Step 4
(HEAT APPLIED)

Step 5
(HEAT APPLIED)

Step 6 n-TYPE DIFFUSION

Step 7
(HEAT APPLIED)

Step 8

Step 9

LIGHT

Step 10

Step 1

Step 2

Step 3 (HEAT APPLIED)

Step 4

Step 5 (HEAT APPLIED)

Step 6

Step 7

PHOTOELECTRIC DEVICE

This is a division of application Ser. No. 364,314, filed May 29, 1973, now abandoned.

The present invention relates generally to a photoelectric device and particularly to an improved photodiode of the planar type having higher sensitivity to visible light.

Visible light incident on the p-n junction of a photodiode can liberate electron-hole pairs if the photon energy is greater than the band gap energy of the material.

The use of planar-type photodiodes has recently been widespread because of its small leakage current and resistance to high reverse voltages since its planar construction is such as to isolate the *p-n* junction from the outer environment. The isolation serves to protect the internal crystalline structure from contamination by harmful foreign practices and reduce the number of lattice defects and deformations. The planar-type photodiodes include diffused p-n junction type and epitaxial p-n junction type.

To provide satisfactory sensitivity to visible spectrum range, it is important to consider the fact that: (1) the generation of effective carriers in areas up to $10\mu$ deep from the light receiving surface is primarily accounted for by light wavelengths up to 0.7 $\mu$m; (2) shorter the wavelength the smaller the depth of light penetration; and (3) the higher dopant concentration in the surface area results in an increase in the number of lattice defects in that area and this accelerates the recombination of carriers, thus resulting in less contribution of carriers to the photocurrent.

In this case of the diffused junction type photodiode, it is necessay that the depth of junction be as small as possible and that the surface concentration of the diffused impurity be as low as possible. The diffused junction type has disadvantages in that the surface impurity concentration decreases with increasing depth from the surface and that the diffused junction area has a higher impurity concentration than in the substrate region. This resulted in a shorter diffusion length for the minority carrier generated in areas closer to the light receiving surface than in the deeper areas, and hence, less sensitivity to the shorter wavelength region of the spectrum. This led to the development of epitaxial method whereby it is possible to select a suitable impurity of the opposite conductivity at a desired concentration irrespective of the substrate material used. This allows a design in which the surface impurity concentration can be held at a value lower than in the substrate.

The epitaxial photodiode, on the other hand, requires a number of heat treatments involving the deposition of oxide layers, the diffusion of p-type impurity to the epitaxially grown n-type layer through etched portions of the oxide layer to isolate the n-type layer and the diffusion of higher concentration on the n-type layer through the etched window of the n-type layer. Between the heat treatment steps the diode is subjected to etching processes wherein the diode is at lower temperatures. This cyclically repeated application of heat resulted in lattice defects and in contamination by heavy metals such as nickel, iron, copper and gold. This resulted in a short diffusion length of minority carriers, particularly, in the light-receiving n-type layer. Therefore, the epitaxial photodiode has a less sensitivity to the visible light and a large dark current when subjected to a reverse voltage across the junction since the depletion layer tends to spread toward the higher conductivity layer (n-type layer) and reduces the minority carrier lifetime in the n-type layer. Furthermore, the n-diffusion layer which has been provided on the epitaxial layer to reduce the recombination of minority carriers acts in a way to increase its sensitivity to the visible light range (4000 to 6000 A). In addition, since the isolation of n-type layer is effected by diffusing a p-type impurity through slot-like etched portions of the oxide layer, with the p-type diffusion reaching the p-type substrate, the isolated n-type layer is positioned adjacent the surrounding p-type regions. This proximity lowers the breakdown voltage of the p-n junction.

It is accordingly an object of the present invention to obviate the above-stated disadvantages and to provide an improved planar-type photodiode having an epitaxially grown p-n junction having a minimum number of lattice defects with increased device sensitivity to the visible light.

Another object of the invention is to provide an improved photodiode of the epitaxial planar type having small dark current.

A further object of the invention is to provide a method of producing a photodiode through minimum number of heat treatment steps.

These and other objects of the invention will be better understood from the following description when taken in conjunction with the accompanying drawings, in which.

In brief, the present invention provides an improved photodiode with higher sensitivity to visible spectrum range and low dark current characteristic and the method of producing the same. In accordance with the present invention, an n-type layer is epitaxially grown on a p-type substrate and then etched to provide a plurality of mesa-type islands of n-type conductivity. An oxide layer is deposited on the entire surface of the islands and the etched portion. The oxide layer deposited on the island is etched to provide a window to provide a light receiving surface. The exposed area is diffused with an n-type impurity dopant to a depth smaller than the thickness of the epitaxial layer to provide a higher carrier concentration than that of the layer. The present invention is therefore characterized in that the number of heat application steps has been reduced with the result that lattice defects which could otherwise occur have been prevented from occurring in the crystalline structure of the p-n junction.

Figure 1:
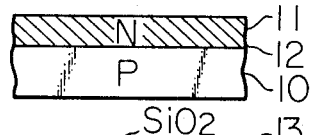
FIG. 1 shows a prior art process of fabricating epitaxial planar type photodiodes wherein n-type layer is epitaxially grown on a p-type substrate.
Figure 1:
Figure 1:
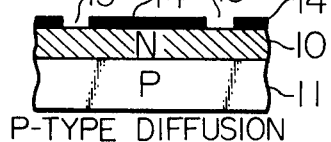
Figure 1:
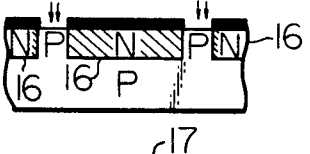
Figure 1:
Figure 1:
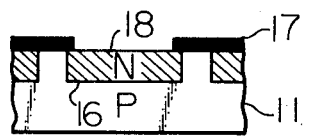
Figure 1:
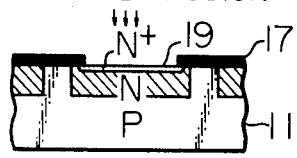
Figure 1:
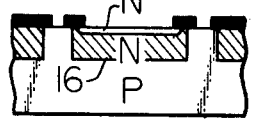
Figure 1:
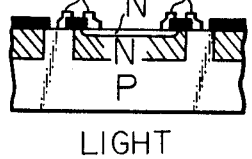
Figure 1:
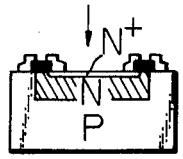
Figure 2:
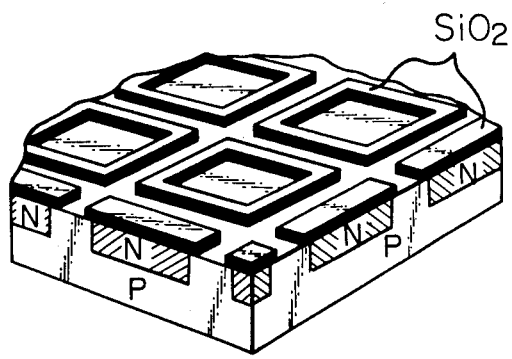
FIG. 2 is a perspective view of the p-type substrate, partly broken away, with an n-type layer being deposited thereon in accordance with the prior art process, wherein metal electrodes are not provided for clarity.
Figure 4:
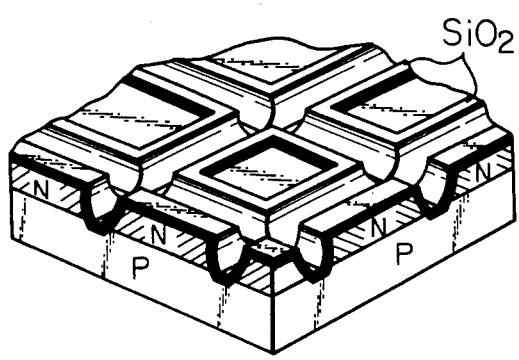
FIG. 4 is a perspective view of the p-type substrate, partly broken away, with a n-type layer deposited thereon and with grooves extending through the layer according to the process of the present invention, wherein the metal electrodes are not shown for clarity.

Prior to the detailed description of the present invention, reference is now made to FIG. 1 in which there is shown a prior art process of fabricating an epitaxial planar-type photodiode. In the first step, an n-type layer 11 of several ohm-cm is grown on a p-type silicon substrate 10 to form a p-n junction 12 therebetween. In the second step an oxide layer 13 is formed on the epitaxial layer 11 by heating at a high temperature in an oxidizing atmosphere. The oxide layer 13 is then photoetched to provide a plurality of etched portions 15. Through the etched portions 15 a p-type impurity is diffused at a temperature of 1100°C for about 1 hour so that the diffused impurity reaches the p-type substrate 11 to provide a plurality of isolated n-type regions 16. Next, oxidization is again carried out at a high temperature to provide an oxide layer 17 to cover the entire surface of the substrate and then the oxide layer 17 is etched to provide a window 18 which allows the exposed areas to serve as the light-receiving surface. Through the window 18 an n-type impurity is diffused on the exposed area at a high temperature to give a thin layer 19 (less than 1 $\mu$m thick) of an impurity concentration of at least $10^{20}cm^{-3}$ on the immediate surface portion of the isolated n-type regions 16. This is for the purpose of giving a decreasing potential gradient inwardly from the surface to reduce the recombination of light-induced minority carriers (holes) generated in regions up to 1$\mu$m deep from the surface. In the steps that follow, the oxide layers 17 directly above the diffused p-type regions are etched (FIG. 2) and aluminum is deposited on the oxide layer to form a plurality of electrodes 20. Finally, the substrate is separated by a well known method to produce a plurality of planar-type epitaxial photodiodes.

Figure 3:
FIG. 3 illustrates a process of fabricating epitaxial mesa-type photodiodes in accordance with the present invention with metal electrodes being removed for clarity.
Figure 3:
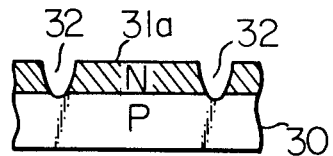
Figure 3:
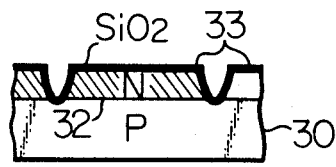
Figure 3:
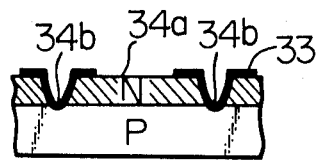
Figure 3:
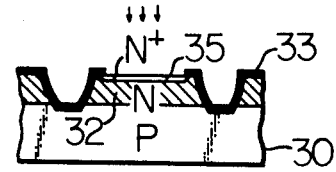
Figure 3:
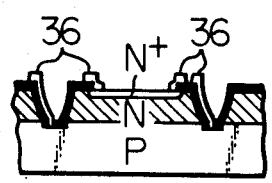
Figure 3:
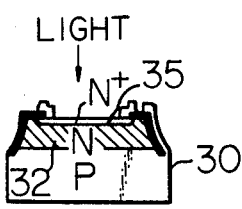

Referring to FIG. 3 wherein there is shown a process of fabricating an epitaxial planar-type photodiodes in accordance with the present invention. On a p-type silicon substrate 30 having a carrier concentration of $10^{18}cm^{-3}$ there is epitaxially grown an n-type layer 31 having a carrier concentration of $10^{15}cm^{-3}$ to a thickness of about 2 microns. A depletion layer occurs within the n-type layer because of its lower carrier concentration than that of the substrate 30 adjacent to the surface on which light will be made to be incident. The occurrence of the depletion layer adjacent to the light-receiving surface causes the p-n junction to collect more minority carriers generated within the areas immediate to the surface than it otherwise would. Since the minority carriers which are generated in response to the shorter wavelength region of the spectrum are present in that immediate areas, the device sensitivity to the shorter wavelength region is increased while its sensitivity to the longer wavelength region is decreased. The n-type layer 31 is photo-etched through a plurality of intersecting slits bv means of a mixture of hydrofluoric and nitric acids to a depth reaching the substrate and slightly thereinto to provide a plurality of intersecting grooves 32 which separate the epitaxial layer 31 into a plurality of isolated regions 31a. With this etching, the substrate is partially exposed along the grooves 32. It is to be understood that the isolated regions 31a may be formed into any shape including a mesa-type island which has a slope portion around its edges and one having its edges steeply cut. The isolated epitaxial regions and the etched portions including the partially exposed areas of the substrate are surface-oxidized at a temperature of 1000°C for 50 minutes to provide an insulating layer 34 about 3000 A thick. This is followed by a second etching step whereby the insulating layer 34 is etched to provide a window 34a and etched portions 34b so as to provide a light receiving area on the isolated regions 31a. Through the window 34a an n-type impurity is diffused onto the epitaxial region 32 to provide an $n^+$-type layer 35 about 0.2 microns thick having a surface impurity concentration of $10^{18}cm^{-3}$. Aluminum is deposited bv a well known method to provide a plurality of electrodes 36, one being in ohmically in contact with the epitaxial region 31a and the other being in ohmic contact with the substrate 30 through the etched portion 34b. Finally, the substrate 30 is cut out by a well known method to separate individual photodiodes from one another. Light is admitted to fall upon the $n^+$-layer 35 which serves as the light receiving surface of the photodiode.

It is apparent from the foregoing description and the drawings that the process as employed in the practice of the invention has eliminated two heat treatment steps as required in the prior art process such as deposition of silicon dioxide layer 13 and diffusion of a p-type impurity onto the n-type layer 10. The elimination of heat treatment steps reduces the total length of time in which the substrate is subjected to heat and ensures that the diffusion length of minority carriers in the epitaxial layer 32 is not adversely affected, thus resulting in higher sensitivity to the visible light and dark current when biased backwardly.

Figure 5:
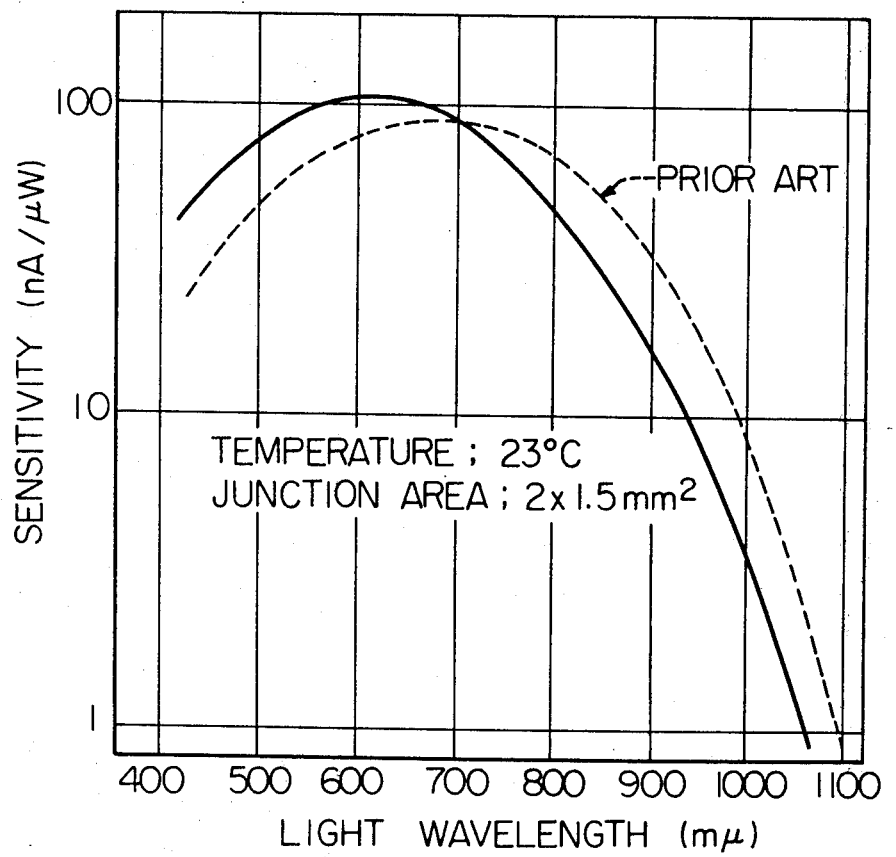
FIG. 5 is a graph illustrating a spectral sensitivity of the photodiode in accordance with the invention with that of the prior art photodiode for comparision.

FIG. 5 illustrates spectral sensitivity of a prior art epitaxial diffusion type photodiode and a photodiode of the present invention (in solid line), the both diodes having a junction area of $2 \times 1.5$ mm². As will be apparent from FIG. 5 the photodiode of the present invention is superior in sensitivity to the visible spectrum range to the prior art.

Figure 6:
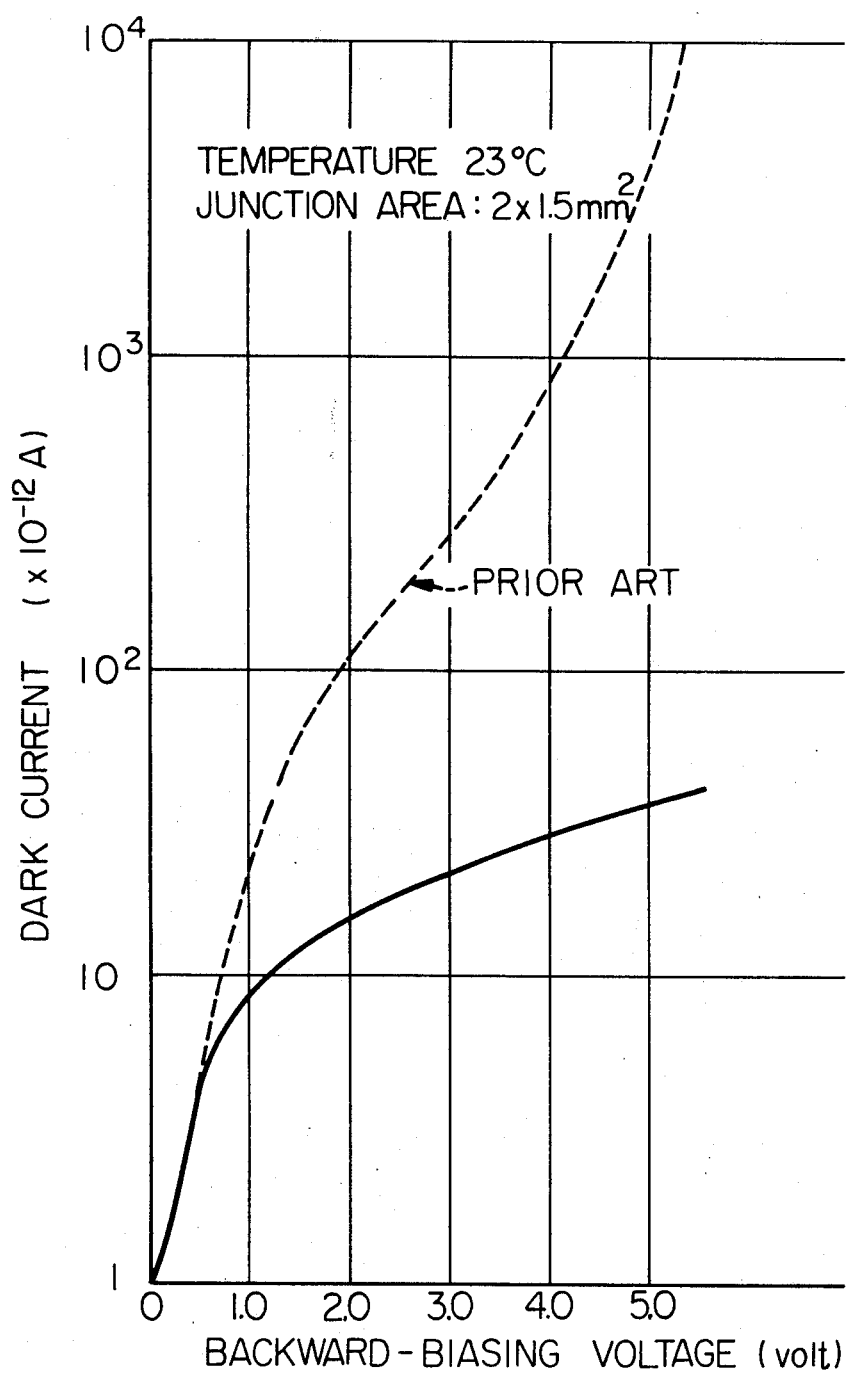
FIG. 6 is a graph illustrating a dark current characteristic of the photodiode of the invention with that of the prior art photodiode for comparison.

When the photodiode according to the invention was subjected to a backward biasing voltage of up to 5 volts the dark current of the order far less than that of the prior art photodiode was obtained as illustrated in FIG. 6.

What is claimed is:

1. A process for fabricating photoelectric devices, comprising:

forming on a semiconductive substrate of one conductivity type having a first carrier concentration of semiconductive layer of opposite conductivity type having a second carrier concentration to define a p-n junction therewith to thereby cause a depletion layer to occur in said layer adjacent said substrate;

etching said semiconductive layer to a depth reaching said substrate and penetrating thereinto to provide a plurality of intersecting grooves to thereby produce a plurality of isolated regions of said opposite conductivity type applying an insulating layer on said isolated regions and said grooves;

etching said insulating layer to provide exposed areas constituting light-receiving windows on said isolated regions of said opposite conductivity type;

applying a plurality of metal electrodes, a respective one of said electrodes being formed as an ohmic contact on only a portion of said exposed area of said layer on each said insolated region and another respective one of said electrodes being formed as an ohmic contact to said substrate beneath said layer via a respective one of said grooves; and separating said substrate along grooves.

2. A process as claimed in claim 1, further comprising diffusing an impurity of said opposite conductivity type providing a carrier concentration greater than said second concentration on said isolated regions to a depth smaller than the thickness of said semiconductive layer.

3. A process as claimed in claim 1, wherein said step of forming a layer on a semiconductive substrate is effected by epitaxially growing said layer.

4. A process as claimed in claim 1, wherein said semiconductive layer is an epitaxial layer.

5. A process as claimed in claim 1 including as a first step providing a substrate having a first carrier concentration of substantially $10^{18}$ cm$^{-3}$ and said forming step forms a layer having a second carrier concentration of substantially $10^{15}$cm$^{-3}$.

* * * * *